(12) United States Patent
Wang et al.

(10) Patent No.: US 11,282,700 B2
(45) Date of Patent: Mar. 22, 2022

(54) METHOD FOR MANUFACTURING PEROVSKITE-BASED DEVICES IN AMBIENT AIR

(71) Applicant: University of Kentucky Research Foundation, Lexington, KY (US)

(72) Inventors: Feng Wang, Hunan (CN); Zhi David Chen, Lexington, KY (US)

(73) Assignee: University of Kentucky Research Foundation, Lexington, KY (US)

( * ) Notice: Subject to any disclaimer, the term of this patent is extended or adjusted under 35 U.S.C. 154(b) by 197 days.

(21) Appl. No.: 16/845,196

(22) Filed: Apr. 10, 2020

(65) Prior Publication Data

US 2020/0335330 A1   Oct. 22, 2020

Related U.S. Application Data

(60) Provisional application No. 62/835,235, filed on Apr. 17, 2019.

(51) Int. Cl.
*H01L 21/02* (2006.01)
*H01L 31/0216* (2014.01)

(52) U.S. Cl.
CPC .. *H01L 21/02197* (2013.01); *H01L 31/02167* (2013.01)

(58) Field of Classification Search
None
See application file for complete search history.

(56) References Cited

U.S. PATENT DOCUMENTS

| | | | |
|---|---|---|---|
| 9,321,717 B2 | 4/2016 | Wu et al. | |
| 11,192,906 B2 * | 12/2021 | Choi | H01L 31/022475 |
| 2016/0322591 A1 | 11/2016 | Seok et al. | |
| 2017/0098514 A1 | 4/2017 | Geohegan et al. | |
| 2017/0250030 A1 | 8/2017 | Druffel et al. | |

(Continued)

FOREIGN PATENT DOCUMENTS

| | | |
|---|---|---|
| CN | 108682745 A | 10/2018 |
| WO | 2017170869 A1 | 10/2017 |

OTHER PUBLICATIONS

Singh et al. "Stabilizing the Efficiency Beyond 20% with a Mixed Cation Perovskite Solar Cell Fabricated in Ambient Air under Controlled Humidity", Advance Energy Materials, 2018, 8, All Pages. (Year: 2018).*

(Continued)

*Primary Examiner* — Daniel P Malley, Jr.
(74) *Attorney, Agent, or Firm* — Stites & Harbison PLLC; Warren D. Schickli

(57) ABSTRACT

A method for manufacturing perovskite-based devices, such as solar cells. In ambient air includes steps of forming a perovskite film on a substrate by spin-coating, the perovskite film having a turbid point when the perovskite film transitions from transparent to turbid in appearance, and dropping an antisolvent on the perovskite film during an antisolvent window having a start time five seconds before the turbid point and an end time one second before the turbid point. The method also includes the step of measuring the current relative humidity of the ambient air at the time of manufacture and adjusting the antisolvent window or optimum drop time of the antisolvent based upon the current relative humidity.

20 Claims, 2 Drawing Sheets

(56) References Cited

U.S. PATENT DOCUMENTS

| | | | |
|---|---|---|---|
| 2017/0287648 A1* | 10/2017 | Wu | H01L 51/0003 |
| 2018/0066383 A1 | 3/2018 | Bakr et al. | |
| 2018/0248142 A1 | 8/2018 | Bakr et al. | |
| 2019/0272960 A1* | 9/2019 | Peng | H01L 51/4233 |
| 2021/0054288 A1* | 2/2021 | Tavakoli | H01L 31/077 |

OTHER PUBLICATIONS

Wozny et al. "Controlled Humidity Study on the Formation of Higher Efficiency Formamidinium Lead Triioide-Based Solar Cells", Chemical Materials, 2015, 27, All Pages. (Year: 2015).*

Rong et al. "Solvent engineering towards controlled grain growth in perovskite planar heterojunction solar cells", Nanoscale, 2015, 7, All Pages. (Year: 2015).*

Yin et al. "Moisture annealing effect on CH3NH3PbI3 films deposited by solvent engineering method", Thin Solid Films, 636, 2017, All Pages. (Year: 2017).*

English Machine Translation of CN108682745A dated Oct. 19, 2018.

English Machine Translation of WO2017170869A1 dated Oct. 5, 2017.

Wang et al; "Humidity-Insensitive Fabrication of Efficient Perovskite Solar Cells in Ambient Air"; Journal of Power Sources; vol. 412, 2019; pp. 359-365.

Ahn et al; "Highly Reproducible Perovskite Solar Cells with Average Efficiency of 18.3% and Best Efficiency of 19.7% Fabricated via Lewis Base Adduct of Lead(II) Iodide"; Journal of the American Chemical Society; Soc. 2015; vol. 137 pp. 8696-8699.

Aranda et al; "Formation Criteria of High Efficiency Perovskite Solar Cells Under Ambient Conditions"; The Royal Society of Chemistry; Sustainable Energy Fuels; 2017, 1, pp. 540-547.

Wang et al; "Steering the Crystallization of Perovskites for High-Performance Solar Cells in Ambient Air"; The Royal Society of Chemistry; DOI: 10.1039/c9ta02566a.

* cited by examiner

METHOD FOR MANUFACTURING PEROVSKITE-BASED DEVICES IN AMBIENT AIR

RELATED APPLICATION

This application claims priority to U.S. Provisional Patent Application Ser. No. 62/835,235 filed on Apr. 17, 2019 which is hereby incorporated by reference in its entirety.

TECHNICAL FIELD

This document relates generally to the production of perovskite-based devices, including perovskite solar cells, and, more particularly, to a new and improved method for producing such perovskite devices and solar cells in ambient air regardless of the current relative humidity of that ambient air.

BACKGROUND

Organic-inorganic halide perovskite solar cells (PSCs) have made great progress since 2009, delivering a certified power conversion efficiency (PCE) over 23% for laboratory-scale solar cells. However, it is noted that high performance PSCs are generally fabricated inside gloveboxes filled with $N_2$ or other inert gases. This demanding condition adds substantial cost for solar panel manufacturing. As a result, there is an urgent need to develop a method for fabrication of PSCs in ambient air without gloveboxes.

Moisture is known to cause decomposition of perovskite, which is the key issue to be dealt with when PSCs are fabricated in ambient air. Several research groups have reported preparation of PSCs in ambient air. Miyasaka's group pioneered the preparation of methylammonium lead iodide ($MAPbI_3$) solar cells with two-step method in ambient air, delivering a champion PCE of 15.3%. Jeong et al. showed that the deposition of perovskite films is humidity-dependent. The average PCE of $MAPbI_3$ PSCs prepared at relative humidity (RH) of 40% was around 10%, almost 10 times of that prepared at 20% RH. Xu et al. pointed out that moisture activates the reaction between $PbI_2$ and methylammonium halides so that a moderate RH level is favored for the two-step method.

Solutions for suppressing the influence of moisture have been proposed to facilitate the preparation of PSCs. Park's group demonstrated that preheating can effectively tune the grain size of $PbI_2$ layers, through which a best PCE of 15.76% for mesostructured PSCs prepared under 50% RH was achieved. Tai et al. replaced $PbI_2$ with $Pb(SCN)_2$ to deposit perovskite films using the two-step method and the corresponding $MAPbI_{3-x}(SCN)_x$ based solar cells showed a maximum PCE around 15%.

Fabrication of PSCs in humid air using the antisolvent method, which is the most widely used technique for fabrication of high performance PCEs, attracts considerable attention due to its simple procedure. Wozny et al. reported preparation of formamidinium lead halide perovskite ($FAPbI_3$) films at various RH levels and found that satisfactory perovskite films could only be formed at very low RH levels. The average PCE of associated $FAPbI_3$ solar cells deteriorates from 15.2% to less than 10% as the humidity level increases from 2% RH to 40% RH. Aranda et al. proposed the ratio of $PbI_2$:dimethyl sulfoxide (DMSO) should be carefully chosen so that high-quality perovskite films can be prepared from $PbI_2$:MAI:DMSO complex in N, N-dimethylformamide (DMF) in ambient air at various humidity levels. Nevertheless, the average PCE of obtained PSCs decreases as the RH increases. Notably, it deteriorates substantially when the RH level rises over 50%.

To resist the effect of humidity on the deposition of perovskite films, Troughton et al. proposed that the selection of antisolvent is critical and observed that ethyl acetate is a better choice than both chlorobenzene (CBZ) and diethyl ether (DE). Ethyl acetate is considered as both antisolvent and moisture absorber so that the influence of moisture is suppressed. However, the average PCE of $MAPbI_3$ PSCs fabricated at 30% RH and 50% RH is around 10%, which is 5% lower than that in the case of 75% RH.

Sveinbjörnsson et al. reported the deposition of mixed-ion $(FAPbI_3)_{1-x}(MAPbBr_3)_x$ on heated substrates and obtained a champion device with an average PCE of 17.6%. However, the humidity level of the fabrication environment is not mentioned. Overall, because the mechanism for the influence of humidity is not well understood, a reliable approach has not been developed for fabrication of high-quality perovskite films in a wide range of humidity levels.

This document relates to a new and improved spin-coating-induced crystallization process wherein an important time point, the "turbid point", has been identified. At the turbid point, the appearance of the $MAPbI_3$ precursor film turns from transparent to turbid. This turbid point is highly sensitive to the ambient RH. In this document, a "humidity-insensitive antisolvent method" is provided. The new method relies upon turbid-point tuning at various humidity levels. Using the novel "humidity-insensitive antisolvent method", efficient PSCs may be fabricated in a wide range of ambient RH levels. The champion device prepared in a humid atmosphere of 90% RH shows a PCE of 19.5%, exceeding all other PSCs prepared in ambient air over 30% RH by methods known in the art. The proposed method can be applied not only to PSCs but also to other perovskites-based devices, including transistors, detectors, and light-emitting diodes etc.

SUMMARY

In accordance with the purposes and benefits described herein, a new and improved method is provided for the manufacturing of perovskite-based devices, such as perovskite solar cells, in ambient air at various relative humidities. That method comprises the steps of (a) forming a perovskite film on a substrate by spin-coating, the perovskite film having a turbid point when the perovskite film transitions from transparent to turbid in appearance and (b) dropping an antisolvent on the perovskite film during an antisolvent window having a start time 3-8 seconds before the turbid point and a stop time one second before the turbid point.

The method may further include the step of identifying timing of the turbid point for the ambient air at different relative humidities. The method may further include the step of measuring a current relative humidity of the ambient air at a current time of the manufacturing of the perovskite-based device and basing timing of the antisolvent window upon the identified timing of the turbid point for the current relative humidity. Still further, the method may include the additional step of measuring the timing of the turbid point from the starting of the spin-coating.

The method may include the step of dropping the antisolvent onto the perovskite film between 4-8 seconds after the starting of the spin-coating when the current relative humidity is 0%.

The method may include the step of dropping the antisolvent onto the perovskite film between 10-14 seconds after the starting of the spin-coating when the current relative humidity is 50%.

The method may include dropping the antisolvent onto the perovskite film between 14-18 seconds after the starting of the spin-coating when the current relative humidity is 70%.

The method may include the step of dropping the antisolvent onto the perovskite film between 15-19 seconds after the starting of the spin-coating when the current relative humidity is 90%.

In accordance with an additional aspect, a new and improved perovskite-based device, such as a perovskite-based solar cell, is manufactured with the new and improved method. The new and improved perovskite solar cell is characterized by exhibiting relatively high power conversion efficiency (PCE) for having been manufactured in ambient air. Advantageously, since the new and improved perovskite solar cells are manufactured in ambient air instead of under an inert atmosphere in a glovebox, manufacturing costs are substantially reduced. Thus, the present method represents a significant advance in the art of perovskite solar cell manufacture.

In the following description, there are shown and described several embodiments of the new and improved method for manufacturing a perovskite-based device in ambient air. As it should be realized, the method is capable of other, different embodiments and its several details are capable of modification in various, obvious aspects all without departing from the method as set forth and described in the following claims. Accordingly, the drawings and descriptions should be regarded as illustrative in nature and not as restrictive.

BRIEF DESCRIPTION OF THE DRAWING FIGURES

The accompanying drawing figures incorporated herein and forming a part of the patent specification, illustrate several aspects of the method and together with the description serve to explain certain principles thereof.

DETAILED DESCRIPTION

Figure 1:
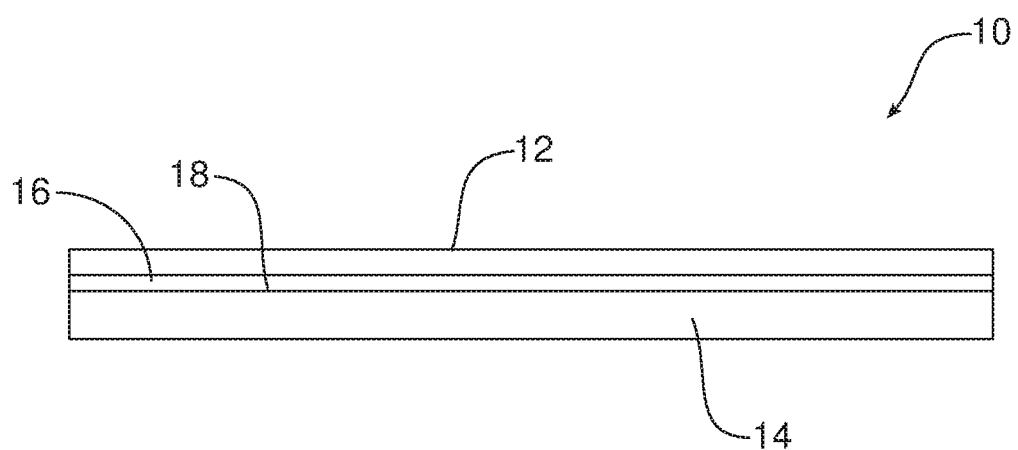
FIG. 1 is a schematic illustration of a perovskite solar cell incorporating a spin-coated perovskite film on a support substrate.
Figure 2:
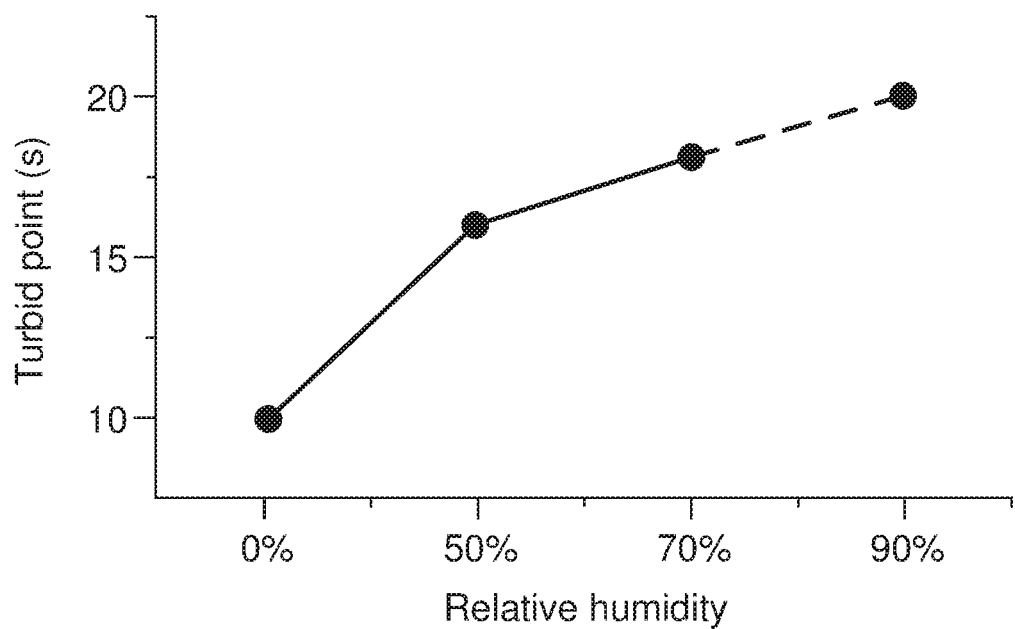
FIG. 2 is a graph of the turbid point in seconds as a function of the relative humidity of the ambient air.

Reference is now made to FIGS. 1 and 2 which illustrate one possible embodiment of a perovskite solar cell 10 of the type made in accordance with the new and improved method 20 for manufacturing perovskite solar cells in ambient air.

As illustrated in FIG. 1, the perovskite cell 10 includes a spin-coated perovskite film 12 on a support substrate 14. The support substrate 14 may comprises any number of materials known to be useful as a support substrate for a solar cell, including, for example, indium tin oxide (ITO) glass. Other useful substrate materials include, but are not necessarily limited to FTO glass, metal, tin oxide, silicon and flexible materials.

A layer 16 of electron transport material is provided on the surface 18 of the support substrate 14 between the support substrate and the outer perovskite film 12. The electron transport layer 16 may be applied or deposited by spin-coating or other means known to those skilled in the art of solar cell manufacture. Useful materials for the electron transport layer 16 include tin oxide ($SnO_2$), titanium oxide ($TiO_2$), mesoporous titanium oxide (m-$TiO_2$) or combinations thereof.

A new and improved method for making the perovskite solar cell 10, such as illustrated in FIG. 1, or other perovskite-based devices, such as transistors, detectors and light emitting diodes will now be described.

That method includes the step of cleaning the support substrate 14 in accordance with a manner known in the art. For example, the support substrate 14 may be cleaned in a detergent aqueous solution, rinsed one or more times with deionized water and then undergo sequential sonication in acetone and ethanol for a predetermined period of time such as fifteen minutes. After the ethanol evaporates, the substrate may be treated by UV-ozone for a predetermined period of time such as 20 minutes.

Next, the method includes the step of applying the electron transport layer 16 on the surface 18 of the support substrate 14. Thus, for example, a compact layer of tin oxide or other electron transport material may be deposited by spin-coating diluted tin oxide aqueous solutions (e.g. $SnO_2$ colloid precursor and deionized water, 1/6 v/v) at 4,000 revolutions per minute for 20 seconds followed by annealing at 165° C. for 30 minutes in air and UV-ozone treatment for 15 minutes.

Here, it should be appreciated that processes, other than spin-coating, that are known to those skilled in the art of perovskite-based device production may be used for applying or depositing the electron transport layer 16 on the surface 18 of the support substrate 14.

Next, the method includes the step of forming a perovskite film 12 on the support substrate 14. More particularly, in the illustrated embodiment, the perovskite film 12 is formed by spin-coating the perovskite film overlying the electron transport layer 16 on the surface 18 of the support substrate 14. The perovskite film 12 has a turbid point when the perovskite film transitions from transparent to turbid in appearance.

Next, the method includes the step of dropping an antisolvent on the perovskite film 12 during an antisolvent window having a start time 3-8 seconds before the turbid point and an end time one second before the turbid point. In another possible embodiment of the method, the antisolvent window has a start time 3-5 seconds before the turbid point and an end time one second before the turbid point. In another possible embodiment of the method, the antisolvent window has a start time of four seconds before the turbid point and an end time of one second before the turbid point. In yet another possible embodiment of the method, the antisolvent window has a start time of three seconds before the turbid point and an end time of one second before the turbid point. Antisolvents useful in the method include, but are not necessarily limited to diethyl ether (DE), chlorobenzene (CBZ), toluene (TL), isopropyl alcohol (IPA) and combinations thereof.

Toward this end, in at least one possible embodiment of the method, a $MAPbI_3$ film is prepared by spin-coating a perovskite precursor solution (1.5 mol. methylammonium iodide (MA)I and lead (II) iodide ($PbI_2$) in 1 ml mixed solvent of dimethylformamide (DMF) and dimethyl sulfoxide (DMSO), 9:1 v/v) at 4,000 revolutions per minute for 25 seconds followed by dropping 300 ul antisolvent (diethyl ether (DE) or chlorobenzene (CBZ) approximately 1-5 seconds before the turbid point. The perovskite film 12 may then be heated to 100° C. for a predetermined period of time such as five minutes.

The method may further include the step of identifying the timing of the turbid point for the ambient air at different relative humidities. See FIG. 2 illustrating the turbid point in seconds as a function of the relative humidity of the ambient air. This Figure allows one to identify the antisolvent timing window for dropping the antisolvent at any current relative humidity shown in FIG. 2.

Thus, it should be appreciated that the method may also include the step of measuring the current relative humidity of the ambient air at the time of the manufacturing of the perovskite-based device and basing timing of the antisolvent window (and, therefore, the dropping of the antisolvent) upon the identified timing of the turbid point for the current relative humidity as illustrated in FIG. 2. In this regard, the method may include the step of measuring the timing of the turbid point from the starting of the spin-coating.

Thus, in accordance with the data presented in FIG. 2, the method may include the step of dropping the antisolvent onto the perovskite film between 4-8 seconds after the starting of the spin-coating when the current relative humidity is 0%. Alternatively, the method may include the step of dropping the antisolvent onto the perovskite film between 10-14 seconds after the starting of the spin-coating when the current relative humidity is 50%.

In yet another possible embodiment, the method may include the step of dropping the antisolvent onto the perovskite film between 14-18 seconds after the starting of the spin-coating when the current relative humidity is 70%. In yet another possible embodiment, the method may include the step of dropping the antisolvent onto the perovskite film between 15-19 seconds after the starting of the spin-coating when the current relative humidity is 90%.

In summary, the method of manufacturing of a perovskite-based device in ambient air set forth herein may be broken down into two steps: (1) spin-coating-induced crystallization of a perovskite precursor film and (2) enhanced nucleation through solvent extraction by dropping antisolvent.

For best results, it is necessary to determine the optimum point of time at which to drop the antisolvent. As indicated above, the optimum time point or antisolvent window is closely related to the turbid point and usually several seconds before the turbid point. Dropping the antisolvent too early or too late leads to bad morphology of the perovskite film and a reduction in the power conversion efficiency of the manufactured perovskite solar cell.

As illustrated in FIG. 2, as the relative humidity of the ambient air rises, the turbid point is delayed. Thus, in order to determine and drop the antisolvent at the optimum time, it is necessary to measure the current relative humidity of the ambient air at the time of manufacture and then adjust the time at which to drop the antisolvent based upon the effect of the current relative humidity on the turbid point as indicated in FIG. 2.

Advantageously, the method allows for the production of perovskite-based devices, including perovskite solar cells, having a relatively high power conversion efficiency at a substantially reduced cost. This is accomplished by eliminating the need for manufacture in a glove box under an inert atmosphere as currently required by state-of-the-art manufacturing methods used to manufacture perovskite solar cells having similar levels of power conversion efficiency.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled.

What is claimed:

1. A method for manufacturing of a perovskite-based device in ambient air, comprising:
   forming a perovskite film on a substrate by spin-coating, the perovskite film having a turbid point when the perovskite film transitions from transparent to turbid in appearance; and
   dropping an antisolvent on the perovskite film during an antisolvent window having a start time 3-8 seconds before the turbid point and a stop time one second before the turbid point.

2. The method of claim 1, wherein the turbid point of the perovskite film has a time that is based on a current relative humidity of the ambient air.

3. The method of claim 2, including measuring the current relative humidity of the ambient air at a current time of the manufacturing of the perovskite-based device and basing timing of the antisolvent window upon the time of the turbid point for the current relative humidity.

4. The method of claim 3, wherein the time of the turbid point is measured from the start of the spin-coating.

5. The method of claim 4, including dropping the antisolvent onto the perovskite film between 4-8 seconds after the starting of the spin-coating when the current relative humidity is 0%.

6. The method of claim 4, including dropping the antisolvent onto the perovskite film between 10-14 seconds after the starting of the spin-coating when the current relative humidity is 50%.

7. The method of claim 4, including dropping the antisolvent onto the perovskite film between 14-18 seconds after the starting of the spin-coating when the current relative humidity is 70%.

8. The method of claim 4, including dropping the antisolvent onto the perovskite film between 15-19 seconds after the starting of the spin-coating when the current relative humidity is 90%.

9. The method of claim 1, including dropping the antisolvent onto the perovskite film between 4-8 seconds after starting of the spin-coating when the current relative humidity is 0%.

10. The method of claim 1, including dropping the antisolvent onto the perovskite film between 10-14 seconds after starting of the spin-coating when the current relative humidity is 50%.

11. The method of claim 1, including dropping the antisolvent onto the perovskite film between 14-18 seconds after starting of the spin-coating when the current relative humidity is 70%.

12. The method of claim 1, including dropping the antisolvent onto the perovskite film between 15-19 seconds after starting of the spin-coating when the current relative humidity is 90%.

13. A perovskite-based device made in accordance with the method of claim 1.

14. A perovskite-based device made in accordance with the method of claim 2.

15. A perovskite-based device made in accordance with the method of claim 3.

16. A perovskite-based device made in accordance with the method of claim 4.

17. A perovskite-based device made in accordance with the method of claim 5.

18. A perovskite-based device made in accordance with the method of claim 6.

19. A perovskite-based device made in accordance with the method of claim 7.

20. A perovskite-based device made in accordance with the method of claim 8.

* * * * *